United States Patent [19]
Jones et al.

[11] Patent Number: 5,485,110
[45] Date of Patent: Jan. 16, 1996

[54] ECL DIFFERENTIAL MULTIPLEXING CIRCUIT

[75] Inventors: Kenneth W. Jones; Stephen T. Flannagan, both of Austin, Tex.

[73] Assignee: Motorola Inc., Schaumburg, Ill.

[21] Appl. No.: 189,776

[22] Filed: Feb. 1, 1994

[51] Int. Cl.$^6$ .................. H03K 19/086; H03K 17/62
[52] U.S. Cl. .............. 327/99; 327/117; 327/491; 327/563; 326/126
[58] Field of Search .................. 327/99, 65, 115, 327/117, 411, 491, 563; 326/126

[56] References Cited

U.S. PATENT DOCUMENTS

| | | | |
|---|---|---|---|
| 4,256,980 | 3/1981 | Asada et al. | 327/563 |
| 4,695,749 | 9/1987 | Lam | 326/43 |
| 4,755,693 | 7/1988 | Suzuki et al. | 326/99 |
| 5,047,659 | 9/1991 | Ullrich | 307/269 |
| 5,077,686 | 12/1991 | Rubinstein | 395/550 |
| 5,111,455 | 5/1992 | Negus | 370/112 |
| 5,124,572 | 6/1992 | Mason et al. | 307/269 |
| 5,124,589 | 6/1992 | Shiomi et al. | 307/465 |
| 5,155,451 | 10/1992 | Gladden et al. | 331/1 A |
| 5,172,400 | 12/1992 | Maemura | 377/116 |
| 5,177,380 | 1/1993 | Birrittella | 326/99 |
| 5,196,742 | 3/1993 | McDonald | 327/65 |
| 5,220,212 | 6/1993 | Sinh | 326/99 |

Primary Examiner—Timothy P. Callahan
Assistant Examiner—Terry L. Englund
Attorney, Agent, or Firm—Daniel D. Hill

[57] ABSTRACT

An ECL multiplexing circuit (20) includes two differential pairs (21 and 22) for receiving first and second ECL level input signals, emitter-follower output transistors (27 and 28), and a differential pair (31 and 32) for receiving differential clock signals. The differential clock signals control which of the two differential pairs (21 and 22) is coupled to the emitter-follower output transistors (27 and 28). The ECL level input signals that control a logic state of the output signals is determined by the logic state of the clock signals. The ECL multiplexing circuit (20) receives non-overlapping clock signals and is used in a quadrature frequency divide-by-two circuit (40) to divide a frequency of an input clock signal by two.

18 Claims, 4 Drawing Sheets

FIG.5

ECL DIFFERENTIAL MULTIPLEXING CIRCUIT

FIELD OF THE INVENTION

This invention relates generally to multiplexers, and more particularly, to an ECL (emitter-coupled logic) level differential multiplexing circuit.

BACKGROUND OF THE INVENTION

ECL (emitter-coupled logic) is a type of integrated circuit logic which uses bipolar transistors. As compared to other logic families, such as TTL (transistor-transistor logic), or CMOS (complementary metal-oxide semiconductor) logic, ECL circuits have higher switching speeds, but consume a large amount of power. ECL circuits have the advantage of high speed over other logic families because the voltage swing between high and low logic states is relatively low, and may be less than one $V_{BE}$, where a $V_{BE}$ is the forward biased base-emitter diode voltage drop of a corresponding bipolar transistor.

Typically, in an integrated circuit that receives ECL signals, the ECL signals are buffered and level converted to CMOS or BICMOS logic levels before a logic operation can be performed. BICMOS circuits are so called because they include both bipolar and CMOS transistors in the same circuit. The ECL signals are level converted to CMOS or BICMOS logic levels to provide better operating margins in order to account for process variations, temperature, and noise. Multiplexing, logic operations, and other digital signal processing is performed on the level converted logic signals. In applications requiring very high speeds, such as workstations or super computers, valuable time is lost by doing a level conversion from one logic family to another before the signal processing is performed.

SUMMARY OF THE INVENTION

Accordingly, there is provided, in one form, a multiplexing circuit having first and second differential pairs, and fifth and sixth transistors. The first differential pair has first and second transistors for receiving a first input signal. A first resistive element is coupled between a first power supply voltage terminal and a first current electrode of the first transistor. A second resistive element is coupled between the first power supply voltage terminal and a first current electrode of the second transistor. The second differential pair has third and fourth transistors for receiving a second input signal. A first current electrode of the third transistor is coupled to the first current electrode of the first transistor, and a first current electrode of the fourth transistor is coupled to the first current electrode of the second transistor. The fifth transistor has a first current electrode coupled to a second current electrode of both of the first and second transistors, a control electrode receives a third input signal, and a second current electrode is coupled to a second power supply voltage terminal. The sixth transistor has a first current electrode coupled to a second current electrode of both of the third and fourth transistors, a control electrode receives a fourth input signal, and a second current electrode is coupled to the second power supply voltage terminal.

In another embodiment, a frequency divide-by-two circuit is provided utilizing the multiplexing circuit. These and other features and advantages will be more clearly understood from the following detailed description taken in conjunction with the accompanying drawings.

DESCRIPTION OF A PREFERRED EMBODIMENT

Generally, the present invention provides a high speed low power ECL multiplexing circuit. This is accomplished by utilizing a combination of series gated differential pairs and common collector differential pairs. ECL level differential clock signals are provided to one differential pair which steers current through one of two other differential pairs which receive ECL level differential input signals. The pair of input signals that control a logic state of the output signals is determined by the logic state of the clock signals.

Figure 1:
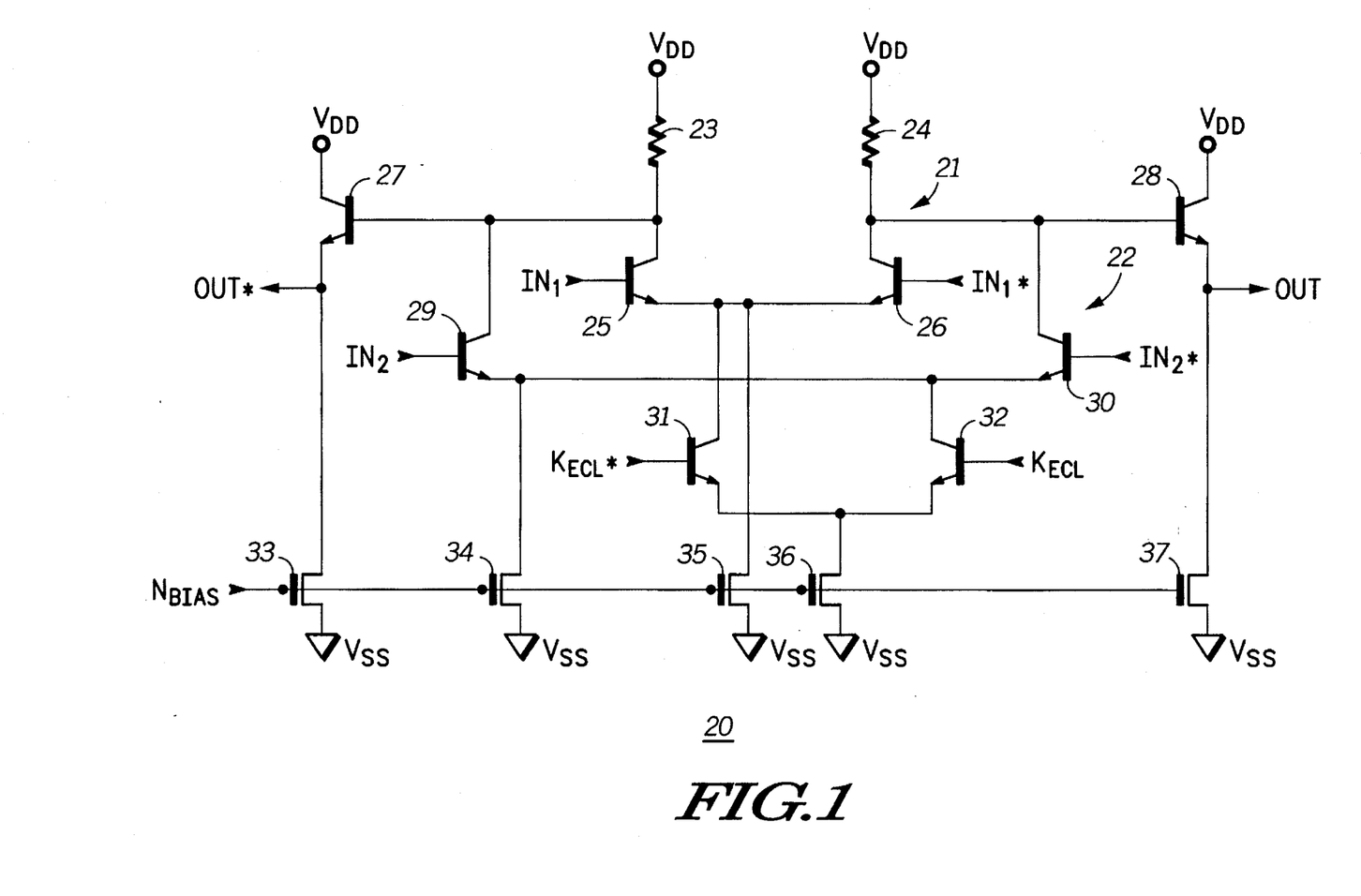
FIG. 1 illustrates in schematic diagram form an ECL multiplexing circuit in accordance with the present invention.

The present invention can be more fully described with reference to FIG. 1–5. FIG. 1 illustrates in schematic diagram form, ECL multiplexing circuit 20 in accordance with the present invention. ECL multiplexing circuit 20 includes resistors 23 and 24, differential pair 21, differential pair 22, NPN transistors 31 and 32, emitter-follower transistors 27 and 28, and N-channel transistors 33–37. Differential pair 21 includes NPN transistors 25 and 26 and differential pair 22 includes NPN transistors 29 and 30.

Resistors 23 and 24 each have a first terminal connected to a power supply voltage terminal labeled "$V_{DD}$", and a second terminal. NPN transistor 25 has a collector connected to the second terminal of resistor 23, a base for receiving an ECL level input signal labeled "$IN_1$", and an emitter. NPN transistor 26 has a collector connected to the second terminal of resistor 24, a base for receiving an ECL level input signal labeled "$IN_1*$", and an emitter connected to the emitter of NPN transistor 25. Note that an asterisk (*) after a signal name indicates that the signal is a logical complement of a signal having the same name but lacking the asterisk. NPN transistor 29 has a collector connected to the collector of NPN transistor 25, a base for receiving an ECL level input signal labeled "$IN_2$", and an emitter. NPN transistor 30 has a collector connected to the collector of NPN transistor 26, a base for receiving an ECL level input signal labeled "$IN_2*$", and an emitter connected to the emitter of NPN transistor 29. NPN transistor 31 has a collector connected to the emitters of NPN transistors 25 and 26, a base for receiving an ECL level clock signal labeled "$K_{ECL}*$", and an emitter. NPN transistor 32 has a collector connected to the emitters of NPN transistors 29 and 30, a base for receiving an ECL level clock signal labeled "$K_{ECL}$", and an emitter connected to the emitter of NPN transistor 31. Emitter-follower transistor 27 has a collector connected to $V_{DD}$, a base connected to the collector of NPN transistor 25, and an emitter for providing an output signal labeled "OUT*". NPN transistor 28 has a collector connected to $V_{DD}$, a base connected to the collector of NPN transistor 26, and an emitter for providing an output signal labeled "OUT".

N-channel transistor 33 has a drain connected to the emitter of emitter-follower transistor 27, a gate for receiving a bias voltage labeled "$N_{BIAS}$", and a source connected to a power supply voltage terminal labeled "$V_{SS}$". N-channel transistor 34 has a drain connected to the emitter of NPN transistor 29, a gate for receiving bias voltage $N_{BIAS}$, and a source connected to $V_{SS}$. N-channel transistor 35 has a drain connected to the emitters of NPN transistors 25 and 26, a gate for receiving bias voltage $N_{BIAS}$, and a source connected to $V_{SS}$. N-channel transistor 36 has a drain connected to the emitters of NPN transistors 31 and 32, a gate for receiving bias voltage $N_{BIAS}$, and a source connected to $V_{SS}$. N-channel transistor 37 has a drain connected to the emitter of emitter-follower transistor 28, a gate for receiving $N_{BIAS}$, and a source connected to $V_{SS}$. N-channel transistors 33–37 are biased to function as relatively constant current sources. In a preferred embodiment, $V_{SS}$ receives a power supply voltage equal to approximately −5.0, and $V_{DD}$ is connected to ground potential. However, in other embodiments, $V_{DD}$ may be connected to a positive power supply voltage, and $V_{SS}$ may be connected to ground.

In the embodiment illustrated in FIG. 1, either one of two pairs of differential signals is selected, differential input signals $IN_1/IN_1^*$ or differential input signals $IN_2/IN_2^*$. Differential clock signals $K_{ECL}/K_{ECL}^*$ determine which differential signal pair is selected. If clock signal $K_{ECL}$ is a logic high and clock signal $K_{ECL}^*$ is a logic low, the logic state of differential input signals $IN_2/IN_2^*$ will control the current in resistors 23 and 24. If clock signal $K_{ECL}^*$ is higher than clock signal $K_{ECL}$, then the logic state of differential input signals $IN_1/IN_1^*$ will control the current in resistors 23 and 24. Current is steered through the transistor whose controlling input signal is a higher voltage, or logic state. For example, if clock signal $K_{ECL}$ is a logic high, then input signals $IN_2/IN_2^*$ control the logic state of output signals OUT/OUT*. Therefore, if input signal $IN_2^*$ is a logic high, and input signal $IN_2$ is a logic low, current is steered through resistor 24, causing output signal OUT to be a logic low and output signal OUT* to be a logic high. If clock signal $K_{ECL}^*$ is a logic high, then input signals $IN_1/IN_1^*$ control the logic state of output signals OUT/OUT*. Therefore, if input signal $IN_1^*$ is a logic high, and input signal $IN_1$ is a logic low, current is steered through resistor 24, causing output signal OUT to be a logic low and output signal OUT* to be a logic high. On the other hand, if input signal $IN_1^*$ is a logic low and input signal $IN_1$ is a logic high when clock signal $K_{ECL}^*$ is a logic high, current is steered through resistor 23, output signal OUT* will be low and output signal OUT will be a logic high.

As noted above, N-channel transistors 33, 34, 35, 36, and 37 are used as current sources. N-channel transistors 33 and 37 provide current for emitter-follower transistors 27 and 28, respectively. N-channel transistor 36 supplies a current that is steered by the clock signals $K_{ECL}/K_{ECL}^*$ to resistors 23 and 24. N-channel transistors 34 and 35 are low current, voltage level "keepers", that prevent common emitter voltages of differential pairs, 22 and 21, respectively, from changing if the bases of NPN transistors 31 and 32 are not receiving clock signals $K_{ECL}/K_{ECL}^*$, or are "floating". In other embodiments, MOS (metal-oxide semiconductor) transistors may be substituted for resistors 23 and 24 as long as the size of differential signal outputs OUT/OUT* is not required to be precisely controlled, and there is no danger of the bipolar transistors operating in saturation. A bipolar transistor may operate in saturation if a collector of the transistor is lower in voltage than a base of the transistor. Operation in saturation could be guarded against by using a voltage clamping circuit. The circuit could also be adapted for use with single-ended signals by replacing logical complement (*) input signals with reference voltages that are set at the midpoint between the high and low levels of the input signals. Also, only one emitter-follower transistor (27 or 28) would be needed since the output signal would be single-ended.

Figure 2:
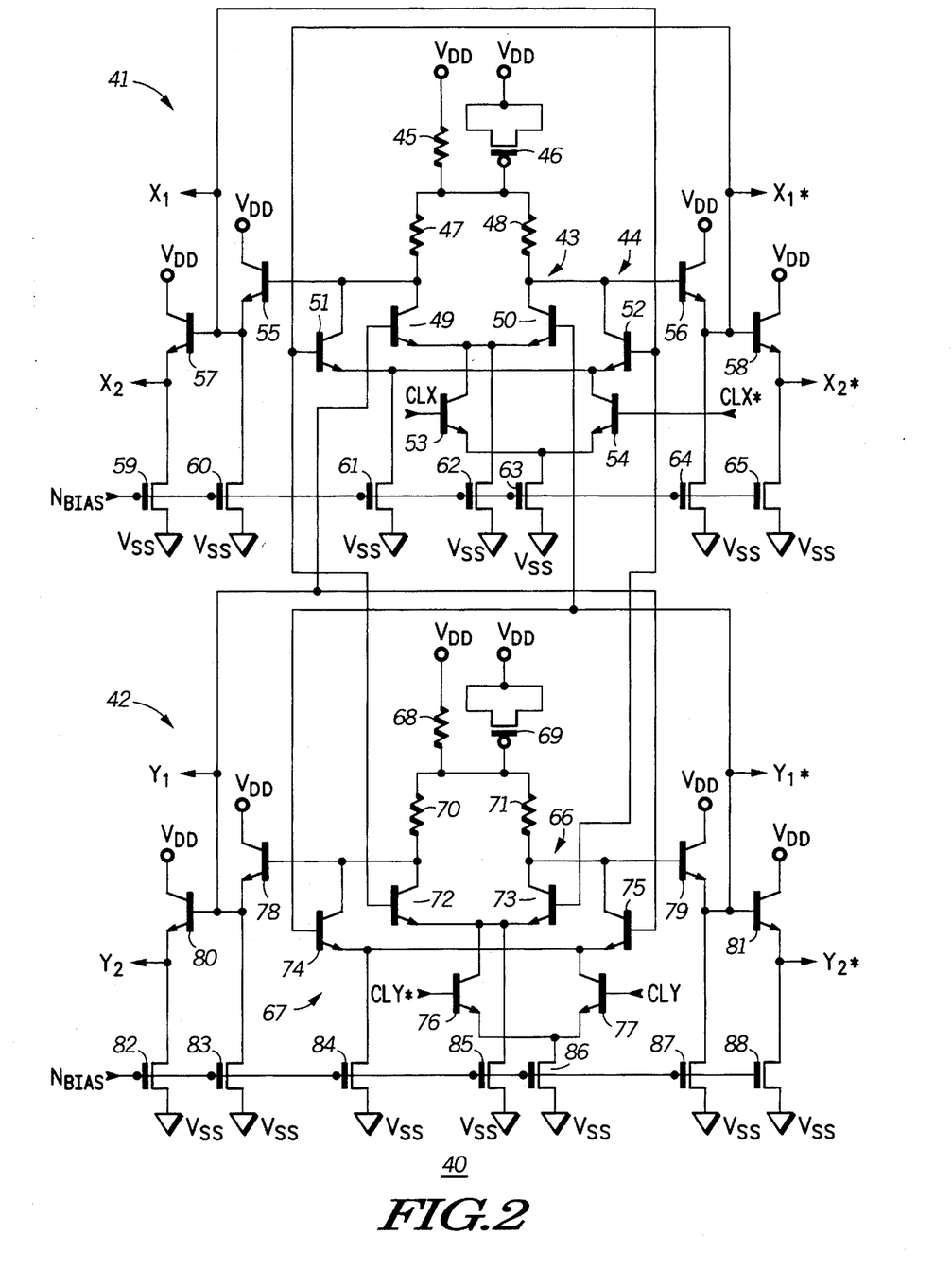
FIG. 2 illustrates in schematic diagram form an ECL quadrature frequency divide-by-two circuit utilizing an embodiment of the ECL multiplexing circuit of FIG. 1.

FIG. 2 illustrates in schematic diagram form, ECL quadrature frequency divide-by-two circuit 40 utilizing an embodiment of ECL multiplexing circuit 20 of FIG. 1. ECL quadrature divide-by-two circuit 40 includes ECL multiplexing circuit 41 and 42. ECL multiplexing circuit 41 includes resistors 45, 47, and 48, capacitor 46, differential pairs 43 and 44, NPN transistors 53 and 54, emitter-follower transistors 55–58, and N-channel transistors 59–65. ECL multiplexing circuit 42 includes resistors 68, 70, and 71, capacitor 69, differential pairs 66 and 67, NPN transistors 76 and 77, emitter-follower transistors 78–81, and N-channel transistors 82–88.

In ECL multiplexing circuit 41, resistor 45 has a first terminal connected to $V_{DD}$, and a second terminal. Capacitor 46 has a first plate electrode connected to $V_{DD}$, and a second plate electrode connected to the second terminal of resistor 45. Resistors 47 and 48 each have a first terminal connected to the second terminal of resistor 45, and a second terminal. NPN transistor 49 has a collector connected to the second terminal of resistor 47, a base, and an emitter. NPN transistor 50 has a collector connected to the second terminal of resistor 48, a base, and an emitter connected to the emitter of NPN transistor 49. NPN transistor 51 has a collector connected to the collector of NPN transistor 49, a base, and an emitter. NPN transistor 52 has a collector connected to the collector of NPN transistor 50, a base, and an emitter connected to the emitter of NPN transistor 51. NPN transistor 53 has a collector connected to the emitters of NPN transistors 49 and 50, a base for receiving an ECL level clock signal labeled "CLX", and an emitter. NPN transistor 54 has a collector connected to the emitters of NPN transistors 51 and 52, a base for receiving an ECL level clock signal labeled "CLX*", and an emitter.

Emitter-follower transistor 55 has a collector connected to $V_{DD}$, a base connected to the collector of NPN transistor 49, and an emitter for providing an output signal labeled "$X_1$". Emitter-follower transistor 56 has a collector connected to $V_{DD}$, a base connected to the collector of NPN transistor 50, and an emitter for providing an output signal labeled "$X_1^*$". Emitter-follower transistor 57 has a collector connected to $V_{DD}$, a base connected to the emitter of emitter-follower transistor 55, and an emitter for providing output signal labeled "$X_2$". Emitter-follower transistor 58 has a collector connected to $V_{DD}$, a base connected to the emitter of emitter-follower transistor 56, and an emitter for providing an output signal labeled "$X_2^*$".

N-channel transistor 59 has a drain connected to the emitter of emitter-follower transistor 57, a gate for receiving bias voltage $N_{BIAS}$, and a source connected to $V_{SS}$. N-channel transistor 60 has a drain connected to the emitter of emitter-follower transistor 55, a gate for receiving bias voltage $N_{BIAS}$, and a source connected to $V_{SS}$. N-channel transistor 61 has a drain connected to the emitters of NPN transistors 51 and 52, a gate for receiving bias voltage $N_{BIAS}$, and a source connected to $V_{SS}$. N-channel transistor 62 has a drain connected to the emitters of NPN transistors 49 and 50, a gate for receiving bias voltage $N_{BIAS}$, and a source connected to $V_{SS}$. N-channel transistor 63 has a drain connected to the emitters of NPN transistors 53 and 54, a gate for receiving bias voltage $N_{BIAS}$, and a source connected to $V_{SS}$. N-channel transistor 64 has a drain connected to the emitter of emitter-follower transistor 56, a gate for receiving bias voltage $N_{BIAS}$, and a source connected to $V_{SS}$. N-channel transistor 65 has a drain connected to the emitter of emitter-follower transistor 58, a gate for receiving bias voltage $N_{BIAS}$, and a source connected to $V_{SS}$.

Figure 3:
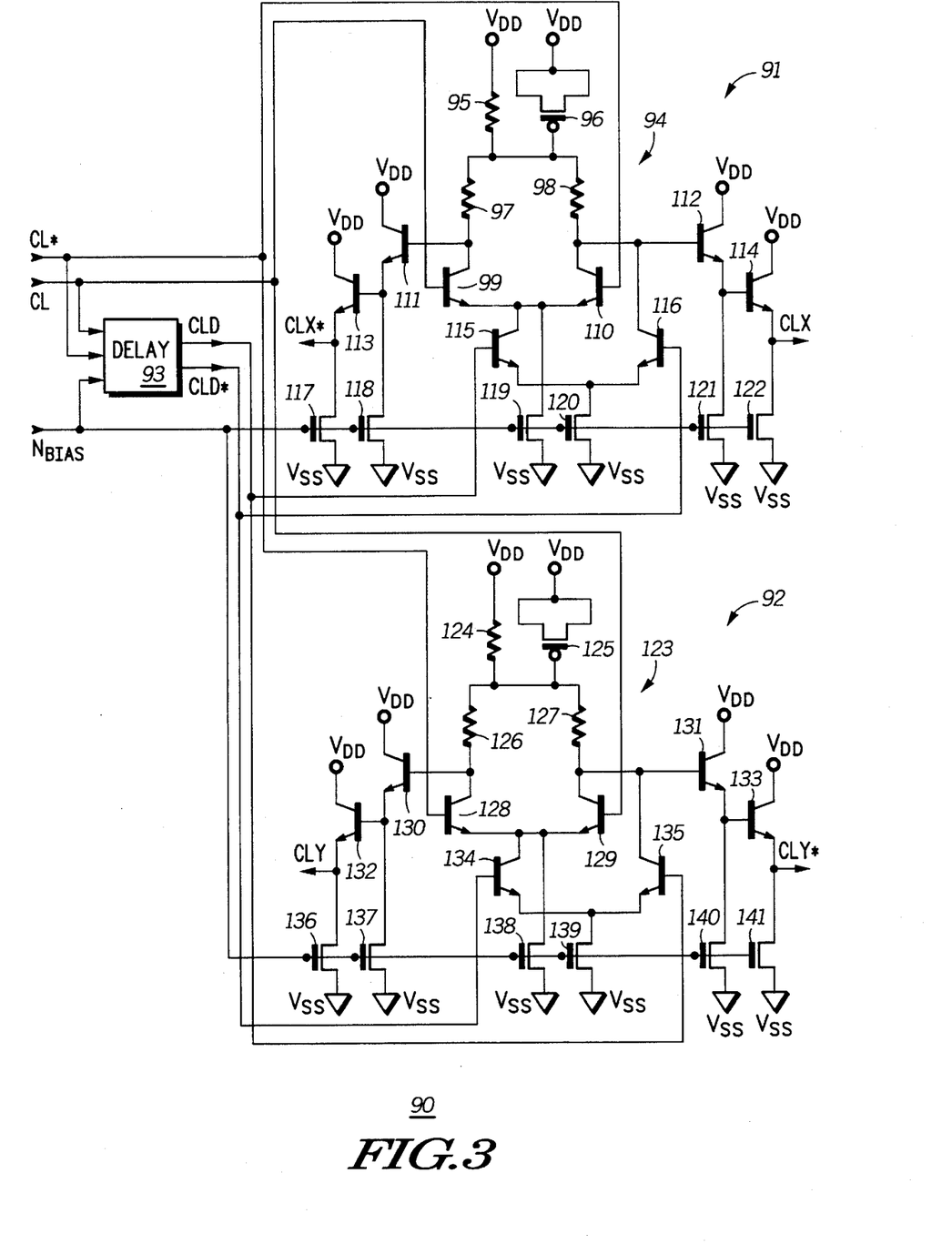
FIG. 3 illustrates in partial schematic diagram form and partial block diagram form a non-overlapping clock generator for providing non-overlapping clock signals to the ECL quadrature frequency divide-by-two circuit of FIG. 2.

ECL multiplexing circuit 42 is constructed in the same manner as ECL multiplexing circuit 41. However, NPN transistor 76 of ECL multiplexing circuit 42 receives a clock signal labeled "CLY*", and NPN transistor 77 receives a clock signal labeled "CLY". Clock signals CLX, CLX*, CLY, and CLY* are non-overlapping clock signals as illustrated in the timing diagram of FIG. 5. The circuit used for providing the non-overlapping clock signals is illustrated in FIG. 3, and will be discussed later.

In ECL quadrature frequency divide-by-two circuit 40, the base of NPN transistor 49 is connected to the emitter of emitter-follower transistor 78 and to the base of NPN transistor 75. The base of NPN transistor 50 is connected to the emitter of emitter-follower transistor 79 and to the base of NPN transistor 74. The base of NPN transistor 51 is connected to the base of NPN transistor 72 and to the emitter of emitter-follower transistor 56. The base of NPN transistor 52 is connected to the base of NPN transistor 73 and to the emitter of emitter-follower transistor 55.

In operation, output clock signals $X_2$, $X_2^*$, $Y_2$, and $Y_2^*$ are one-half the frequency of input clock signals CLX, CLX*, CLY, and CLY*. They are in "quadrature" because the X output signals change on a phase opposite the phase of the Y output signals. Input clock signals CLX and CLY are non-overlapping versions of a system clock signal. (The circuit used to generate non-overlapping clock signals CLX/CLX* and CLY/CLY* is illustrated in FIG. 3, and will be discussed later.) ECL multiplexing circuits 41 and 42 are used as latches to obtain the quadrature frequency divide-by-two function. The latching function is obtained by feeding differential output signals $X_1/X_1^*$ back to the bases of NPN transistors 51, 52, 72, and 73, and by feeding differential output signals $Y_1/Y_1^*$ back to the bases of NPN transistors 49, 50, 74 and 75. When a current is steered through their corresponding differential pairs, both of differential output signals $X_1/X_1^*$ and $Y_1/Y_1^*$ are latched. When input clock signal CLX is a logic high, clock signal $Y_1^*$ is multiplexed to provide output signals $X_2/X_2^*$. Since input clock signal CLY is also high, output signals $Y_1/Y_1^*$ are latched in the ECL multiplexing circuit 42. When input clock signal CLX transitions to a logic low, output signals $X_1/X_1^*$ are latched in ECL multiplexing circuit 41, while output signals $Y_1/Y_1^*$ are multiplexed to provide output signals $Y_2/Y_2^*$. In other words, the Y output signals lag the X output signals by one-half of the system clock cycle.

Clock signals CLX and CLY are timed so that at each transition of clock signals CLX and CLY, the signals in ECL multiplexing circuit 41 and ECL multiplexing circuit 42 are latched for a brief period. In the illustrated embodiment, the signals in ECL multiplexing circuit 41 and ECL multiplexing circuit 42 are latched when clock signal CLX is a logic low and clock signal CLY is a logic high. This is done in order to avoid an oscillatory condition that may exist if both of ECL multiplexing circuits 41 and 42 are unlatched at the same time, since the signal path would then be a closed loop.

Resistors 45 and 68 are used to provide a 0.5 $V_{BE}$ drop on the output signals so that output signals $X_2/X_2^*$ and $Y_2/Y_2^*$ are at the proper levels for controlling their destination circuits, such as logic circuits, driver circuits, buffer circuits, or the like. In other embodiments, resistors 45 and 68 may not be necessary. MOS capacitors 46 and 69 are used to stabilize the first terminals of resistors 47 and 48, and resistors 70 and 71, respectively, during current switching, because there is typically a drop in current when switching from one device, or transistor, to another.

FIG. 3 illustrates in partial schematic diagram form and partial block diagram form, non-overlapping clock generator 90 for providing non-overlapping clock signals to ECL quadrature divide-by-two circuit 40 of FIG. 2. Non-overlapping clock generator 90 includes multiplexing circuits 91 and 92, and delay circuit 93. Multiplexing circuit 91 includes resistors 95, 97, and 98, capacitor 96, differential pair 94, NPN transistors 115 and 116, emitter-follower transistors 111–114, and N-channel transistors 117–122. Differential pair 94 includes NPN transistors 99 and 110. Multiplexing circuit 92 includes resistors 124, 126, and 127, capacitor 125, differential pair 123, NPN transistors 134 and 135, emitter-follower transistors 130–133, and N-channel transistors 136–141. Differential pair 123 includes NPN transistors 128 and 129.

In multiplexing circuit 91, resistor 95 has a first terminal connected to $V_{DD}$, and a second terminal. Capacitor 96 has a first plate electrode connected to $V_{DD}$, and a second plate electrode connected to the second terminal of resistor 95. Resistors 97 and 98 each have a first terminal connected to the second terminal of resistor 95, and a second terminal. NPN transistor 99 has a collector connected to the second terminal of resistor 97, a base for receiving a clock signal labeled "CL", and an emitter. NPN transistor 110 has a collector connected to the second terminal of resistor 98, a base for receiving a clock signal labeled "CL*", and an emitter connected to the emitter of NPN transistor 99. NPN transistor 115 has a collector connected to the emitters of NPN transistors 99 and 110, a base for receiving a delayed clock signal labeled "CLD", and an emitter. NPN transistor 116 has a collector connected to the collector of NPN transistor 110, a base for receiving a delayed clock signal labeled "CLD*", and an emitter connected to the emitter of NPN transistor 115.

Emitter-follower transistor 111 has a collector connected to $V_{DD}$, a base connected to the collector of NPN transistor 99, and an emitter. Emitter-follower transistor 112 has a collector connected to $V_{DD}$, a base connected to the collector of NPN transistor 110, and an emitter. Emitter-follower transistor 113 has a collector connected to $V_{DD}$, a base connected to the emitter of emitter-follower transistor 111, and an emitter for providing clock signal CLX*. Emitter-follower transistor 114 has a collector connected to $V_{DD}$, a base connected to the emitter of emitter-follower transistor 112, and an emitter for providing clock signal CLX.

N-channel transistor 117 has a drain connected to the emitter of emitter-follower transistor 113, a gate for receiving bias voltage $N_{BIAS}$, and a source connected to $V_{SS}$. N-channel transistor 118 has a drain connected to the emitter of emitter-follower transistor 111, a gate for receiving bias voltage $N_{BIAS}$, and a source connected to $V_{SS}$. N-channel transistor 119 has a drain connected to the emitters of NPN transistors 99 and 110, a gate for receiving bias voltage $N_{BIAS}$, and a source connected to $V_{SS}$. N-channel transistor 120 has a drain connected to the emitters of NPN transistors 115 and 116, a gate for receiving bias voltage $N_{BIAS}$, and a source connected to $V_{SS}$. N-channel transistor 121 has a drain connected to the emitter of emitter-follower transistor 112, a gate for receiving bias voltage $N_{BIAS}$, and a source connected to $V_{SS}$. N-channel transistor 122 has a drain connected to the emitter of emitter-follower transistor 114, a gate for receiving bias voltage $N_{BIAS}$, and a source connected to $V_{SS}$. N-channel transistors 117–122 are biased to function as relatively constant current sources.

Multiplexing circuit 92 is connected in the same manner as multiplexing circuit 91, except that base of NPN transistor 128 receives clock signal CL*, the base of NPN transistor 129 receives clock signal CL, the base of NPN transistor 134 receives clock signal CLD*, and the base of NPN transistor 135 receives clock signal CLD.

Non-overlapping clock signals CLX/CLX* and CLY/CLY* are generated by using ECL delay circuit 93 and ECL multiplexing circuits 91 and 92. Delay circuit 93 is an ECL stage that provides a short delay which is used to obtain a period of non-overlap (illustrated in the timing diagram of FIG. 5) in the ECL multiplexing circuits 91 and 92. ECL multiplexing circuits 91 and 92 function as logical AND gates. In ECL multiplexing circuit 91, in order for clock signal CLX to become a logic high, input clock signal CL and delayed clock signal CLD are both logic high. In other words, ECL multiplexing circuit 91 has to wait for delayed clock signal CLD to become a logic high before clock signal CLX can become a logic high. Clock signal CLX becomes a logic low when clock signal CL becomes a logic low. Delayed clock signal CLD does not affect the transition of clock signal CLX from a logic high to a logic low, so there is no delay during this transition. Likewise, in ECL multiplexing circuit 92, clock signal CLY transitions to a logic low after delayed clock signal CLD becomes a logic low. Clock signal CLY becomes a logic high when input clock signal CL becomes a logic high. Since there is a delay when clock signal CLX transitions to a logic high and when clock signal CLY transitions to a logic low, clock signals CLX and CLY are non-overlapping for each transition of input clock signal CL.

Non-overlapping clock generator 90 has a bias toward a non-overlapping logic state of clock signal CLX low and clock signal CLY high when the voltage difference between input clock signals CL and CL* is equal to about zero volts. If the voltage of clock signal CL is equal to approximately the voltage of clock signal CL*, then delayed clock signal CLD is equal to approximately zero volts, and the current in ECL multiplexing circuit 91 is divided equally between NPN transistor 116 and NPN transistor 115. A current through NPN transistor 115 is divided equally between NPN transistor 99 and NPN transistor 110. Therefore, about three-fourths of a current through N-channel transistor 120 is steered through resistor 98 and about one-fourth of the current is steered through resistor 97. In this case, the voltage of clock signal CLX is lower than the voltage of clock signal CLX*, which is the desired non-overlap logic state in a preferred embodiment. Likewise, in ECL multiplexing circuit 92, clock signal CLY* has a lower logic state than clock signal CLY. The bias of non-overlapping clock generator 90 to a predetermined logic stage is also used to keep non-overlapping clock generator 90 from entering an undesirable oscillatory state.

Figure 4:
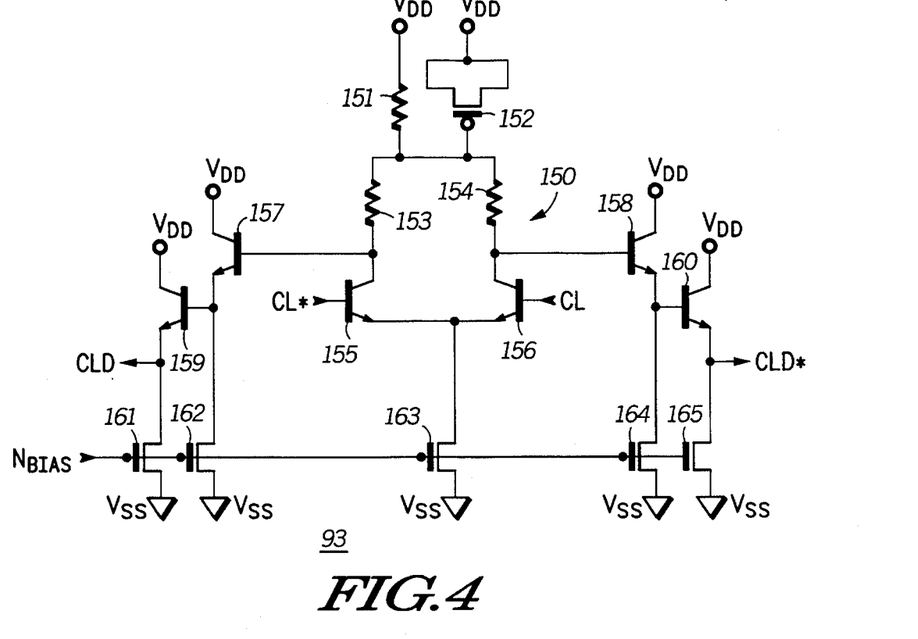
FIG. 4 illustrates in schematic diagram form the delay circuit of FIG. 3.

FIG. 4 illustrates in schematic diagram form, delay circuit 93 of FIG. 3. Delay circuit 93 includes resistor 151, capacitor 152, differential amplifier 150, emitter-follower transistors 157–160, and N-channel transistors 161–165. Differential amplifier 150 includes resistors 153 and 154 and transistors 155 and 156.

Resistor 151 has a first terminal connected to $V_{DD}$, and a second terminal. Capacitor 152 has a first plate electrode connected to $V_{DD}$, and a second plate electrode connected to the second terminal of resistor 151. Resistors 153 and 154 each have a first terminal connected to the second terminal of resistor 151, and a second terminal. NPN transistor 155 has a collector connected to the second terminal of resistor 153, a base for receiving clock signal CL*, and an emitter. NPN transistor 156 has a collector connected to the second terminal of resistor 154, a base for receiving clock signal CL, and an emitter connected to the emitter of NPN transistor 155. Emitter-follower transistor 157 has a collector connected to $V_{DD}$, a base connected to the collector of NPN transistor 155, and an emitter. Emitter-follower transistor 158 has a collector connected to $V_{DD}$, a base connected to the collector of NPN transistor 156, and an emitter. Emitter-follower transistor 159 has a collector connected to $V_{DD}$, a base connected to the emitter of emitter-follower transistor 157, and an emitter for providing delayed clock signal CLD. Emitter-follower transistor 160 has a collector connected to $V_{DD}$, a base connected to the emitter of emitter-follower transistor 158, and an emitter for providing delayed clock signal CLD*. Delayed clock signals CLD and CLD* are differential clock signals.

N-channel transistor 161 has a drain connected to the emitter of emitter-follower transistor 159, a gate for receiving bias voltage $N_{BIAS}$, and a source connected to $V_{SS}$. N-channel transistor 162 has a drain connected to the emitter of emitter-follower transistor 157, a gate for receiving bias voltage $N_{BIAS}$, and a source connected to $V_{SS}$. N-channel transistor 163 has a drain connected to the emitters of NPN transistors 155 and 156, a gate for receiving bias voltage $N_{BIAS}$, and a source connected to $V_{SS}$. N-channel transistor 164 has a drain connected to the emitter of emitter-follower transistor 158, a gate for receiving bias voltage $N_{BIAS}$, and a source connected to $V_{SS}$. N-channel transistor 165 has a drain connected to the emitter of emitter-follower transistor 160, a gate for receiving bias voltage $N_{BIAS}$, and a source connected to $V_{SS}$.

Delay circuit 93 is a differential amplifier stage in which delayed clock signals CLD/CLD* follow input clock signals CL/CL* after a predetermined delay. Resistor 151 and capacitor 152 are used along with emitter-follower transistors 157–160 to set clock signals CLD/CLD* to about $-2.5$ $V_{BE}$ for preventing the bipolar transistors from operating in saturation.

Figure 5:
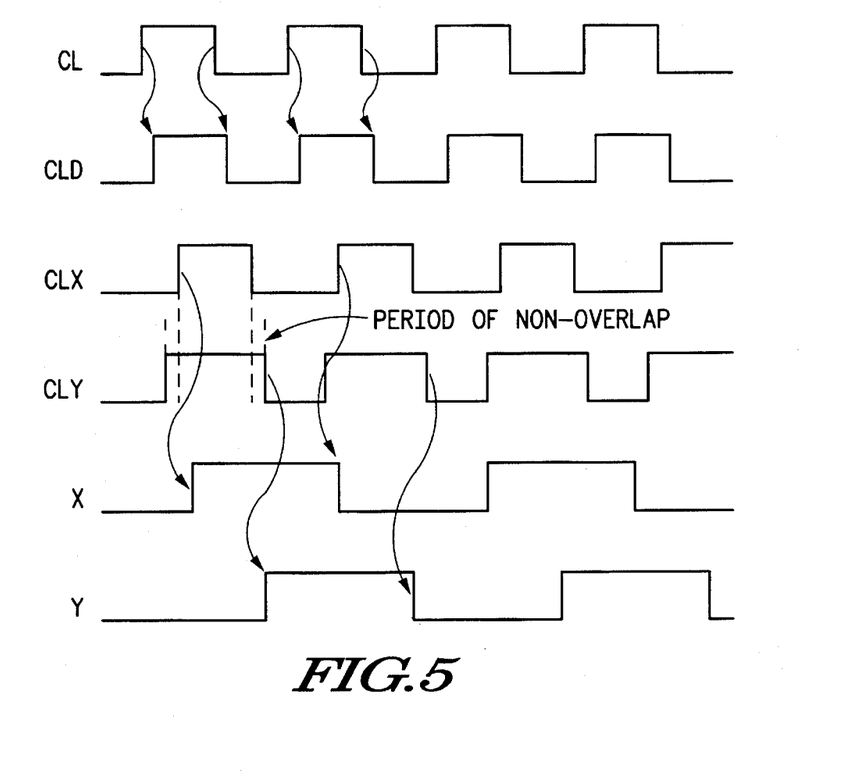
FIG. 5 illustrates a timing diagram of some of the signals of the embodiments of FIG. 2 and 3.

FIG. 5 illustrates a timing diagram of some of the signals of the embodiments of FIG. 2 and FIG. 3. Note that the timing diagram of FIG. 5 is not drawn to scale. Also, all of the signals shown are differential signals in a preferred embodiment; only the true signal of each of the differential signals is shown for simplicity.

In the timing diagram of FIG. 5, delayed clock signal CLD is a short delay after input clock signal CL. Clock signals CLX and CLY are from the non-overlapping clock generator 90. The high transition of clock signal CLX and the low transition of clock signal CLY occur after delayed clock signal CLD changes, whereas the low transition of clock signal CLX and the high transition of clock signal CLY occurs in response to input clock signal CL changing. Output signal X (represents the logic state of either output signal $X_1$ or $X_2$ of FIG. 2) changes state on the rising edge of clock signal CLX, and its logic state is the inverted logic value of Y. Output signal Y (represents the logic state of either output signal $Y_1$ or $Y_2$ of FIG. 2) changes state on the falling edge of clock signal CLY, and its logic state is the same as that of output signal X minus 90 degrees.

ECL quadrature divide-by-two circuit 40 (FIG. 2) generates an ECL output signal having a frequency equal to about one-half of an ECL level clock signal, without using CMOS logic which requires the use of level converters. This reduces power consumption, as well as providing higher switching speeds and reducing the surface area on an integrated circuit. Also, ECL multiplexing circuit 20 provides an advantage over other ECL multiplexing circuits in that ECL multiplexing circuit 20 reduces the number of ECL stages needed to perform a multiplexing function. Fewer ECL stages result in lower power consumption and a higher operating speed.

While the invention has been described in the context of a preferred embodiment, it will be apparent to those skilled in the art that the present invention may be modified in numerous ways and may assume many embodiments other than that specifically set out and described above. For example, single-ended input signals may be used instead of differential signals. Also, the bipolar transistors of the differential pairs may be replaced with N-channel transistors for operating with CMOS level signals. In addition, the ECL multiplexing circuit may have more than two differential pairs, and more than one differential clocking signal to control the selection. In addition, a conventional circuit could be used to generate the non-overlapping clock signals for use with the divide-by-two circuit. Accordingly, it is intended by the appended claims to cover all modifications of the invention which fall within the true spirit and scope of the invention.

What is claimed is:

1. A multiplexing circuit, comprising:
   a first differential pair having first and second transistors, a first resistive element being coupled between a first power supply voltage terminal and a first current electrode of the first transistor, a second resistive element being coupled between the first power supply voltage terminal and a first current electrode of the second transistor, the differential pair for receiving a first input signal;
   a second differential pair having third and fourth transistors, a first current electrode of the third transistor being coupled to the first current electrode of the first transistor, and a first current electrode of the fourth transistor being coupled to the first current electrode of the second transistor, the second differential pair for receiving a second input signal;
   a fifth transistor having a first current electrode coupled to a second current electrode of both of the first and second transistors, a control electrode for receiving a third input signal, and a second current electrode coupled to a second power supply voltage terminal;
   a sixth transistor having a first current electrode coupled to a second current electrode of both of the third and fourth transistors, a control electrode for receiving a fourth input signal, and a second current electrode coupled to the second power supply voltage terminal;
   a first current source having a first terminal coupled to the second current electrodes of the first and second transistors, and a second terminal coupled to the second power supply voltage terminal;
   a second current source having a first terminal coupled to the second current electrodes of the third and fourth transistors, and a second terminal coupled to the second power supply voltage terminal; and
   a third current source having a first terminal coupled to the second current electrodes of the fifth and sixth transistors, and a second terminal coupled to the second power supply voltage terminal.

2. The multiplexing circuit of claim 1, wherein the first, second, third, and fourth transistors are bipolar transistors.

3. The multiplexing circuit of claim 1, wherein the fifth and sixth transistors are bipolar transistors.

4. The multiplexing circuit of claim 1, wherein the first and second input signals are each characterized as being differential input signals at emitter-coupled logic (ECL) levels, and the third and fourth input signals are characterized as being differential clock signals.

5. The multiplexing circuit of claim 1, further comprising a seventh transistor having a first current electrode coupled to the first power supply voltage terminal, a control electrode coupled to the first current electrode of the first transistor, and a second current electrode for providing an output signal.

6. A frequency divide-by-two circuit, comprising:
   a first multiplexing circuit, comprising:
      a first differential pair having first and second transistors, a first resistive element being coupled between a first power supply voltage terminal and a first current electrode of the first transistor, a second resistive element being coupled between the first power supply voltage terminal and a first current electrode of the second transistor;
      a second differential pair having third and fourth transistors, a first current electrode of the third transistor being coupled to the first current electrode of the first transistor, and a first current electrode of the fourth transistor being coupled to the first current electrode of the second transistor;
      a fifth transistor having a first current electrode coupled to a second current electrode of both of the first and second transistors, a control electrode for receiving a first clock signal, and a second current electrode coupled to a second power supply voltage terminal; and
      a sixth transistor having a first current electrode coupled to a second current electrode of both of the third and fourth transistors, a control electrode for receiving a second clock signal, and a second current electrode coupled to the second current electrode of the fifth transistor;
   a second multiplexing circuit, comprising:
      a third differential pair having seventh and eighth transistors, a third resistive element being coupled between the first power supply voltage terminal and a first current electrode of the seventh transistor, a fourth resistive element being coupled between the first power supply voltage terminal and a first current electrode of the eighth transistor, the seventh and eighth transistors having control electrodes coupled to control electrodes of the first and second transistors, respectively, of the first multiplexing circuit;
      a fourth differential pair having ninth and tenth transistors, a first current electrode of the ninth transistor being coupled to the first current electrode of the seventh transistor, and a first current electrode of the tenth transistor being coupled to the first current electrode of the eighth transistor, a control electrode of the ninth and tenth transistors coupled to the control electrodes of the fourth and third transistors, respectively, of the first multiplexing circuit;
      an eleventh transistor having a first current electrode coupled to second current electrodes of both of the seventh and eighth transistors, a control electrode for receiving a third clock signal, and a second current electrode coupled to the second power supply voltage terminal; and a twelfth transistor having a first current electrode coupled to a second current electrode of both of the ninth and tenth transistors, a control electrode for receiving a fourth clock signal, and a second current electrode coupled to the second current electrode of the eleventh transistor.

7. The frequency divide-by-two circuit of claim 6, wherein the first and second clock signals are differential clock signals, the third and fourth clock signals are differential clock signals, and the first, second, third, and fourth clock signals are non-overlapping clock signals.

8. The frequency divide-by-two circuit of claim 6, wherein first, second, third, fourth, seventh, eighth, ninth, and tenth transistors are bipolar transistors.

9. The frequency divide-by-two circuit of claim 6, wherein the fifth, sixth, eleventh and twelfth transistors are bipolar transistors.

10. The frequency divide-by-two circuit of claim 6, wherein the first, second, third, and fourth clock signals are each characterized as being emitter-coupled logic (ECL) level signals.

11. The frequency divide-by-two circuit of claim 6, further comprising:

a first emitter-follower transistor having a first current electrode coupled to the first power supply voltage terminal, a control electrode coupled to the first current electrode of the first transistor, and a second current electrode for providing a first output signal; and a second emitter-follower transistor having a first current electrode coupled to the first power supply voltage terminal, a control electrode coupled to the first current electrode of the seventh transistor, and a second current electrode for providing a second output signal.

12. The frequency divide-by-two circuit of claim 6, further comprising:

a differential amplifier having fifth and sixth resistive elements, and thirteenth and fourteenth transistors, the fifth resistive element being coupled between the first power supply voltage terminal and a first current electrode of the thirteenth transistor, the sixth resistive element being coupled between the first power supply voltage terminal and a first current electrode of the fourteenth transistor, a control electrode of the thirteenth transistor for receiving a fifth clock signal, a control electrode of the fourteenth transistor for receiving a sixth clock signal, and a second current electrode of the thirteenth transistor coupled to a second current electrode of the fourteenth transistor;

a fifteenth transistor having a first current electrode coupled to the second current electrodes of the thirteenth and fourteenth transistors, a control electrode for receiving a first delayed clock signal, and a second current electrode coupled to the second power supply voltage terminal;

a sixteenth transistor having a first current electrode coupled to the first current electrode of the fourteenth transistor, a control electrode for receiving a second delayed clock signal, and a second current electrode coupled to the second power supply voltage terminal;

a first emitter-follower transistor having a first current electrode coupled to the first power supply voltage terminal, a control electrode coupled to the first current electrode of the thirteenth transistor, and a second current electrode for providing the first clock signal; and a second emitter-follower transistor having a first current electrode coupled to the first power supply voltage terminal, a control electrode coupled to the first current electrode of the fourteenth transistor, and a second current electrode for providing the second clock signal.

13. The frequency divide-by-two circuit of claim 12, wherein the fifth and sixth clock signals are characterized as being differential clock signals and the first and second delayed clock signals are characterized as being differential clock signals.

14. The frequency divide-by-two circuit of claim 6, further comprising:

a first current source having a first terminal coupled to the second current electrodes of the first and second transistors, and a second terminal coupled to the second power supply voltage terminal;

a second current source having a first terminal coupled to the second current electrodes of the third and fourth transistors, and a second terminal coupled to the second power supply voltage terminal; and a third current source having a first terminal coupled to the second current electrodes of the fifth and sixth transistors, and a second terminal coupled to the second power supply voltage terminal.

15. An ECL (emitter-coupled logic) multiplexing circuit, comprising:

a first differential pair having first and second bipolar transistors, a first resistive element being coupled between a first power supply voltage terminal and a collector of the first bipolar transistor, a second resistive element being coupled between the first power supply voltage terminal and a collector of the second bipolar transistor, the first differential pair for receiving a first differential ECL level input signal;

a second differential pair having third and fourth bipolar transistors, a collector of the third bipolar transistor being coupled to the collector of the first bipolar transistor, and a collector of the fourth bipolar transistor being coupled to the collector of the second bipolar transistor, the second differential pair for receiving a second differential ECL level input signal;

a fifth bipolar transistor having a collector coupled to an emitter of both of the first and second bipolar transistors, a base for receiving a third ECL level input signal, and an emitter coupled to a second power supply voltage terminal;

a sixth bipolar transistor having a collector coupled to an emitter of both of the third and fourth bipolar transistors, a base for receiving a fourth ECL level input signal, and an emitter coupled to the second power supply voltage terminal;

a first emitter-follower transistor having a collector coupled to the first power supply voltage terminal, a base coupled to the collector of the first bipolar transistor, and an emitter for providing a first ECL level output signal;

a second emitter-follower transistor having a collector coupled to the first power supply voltage terminal, a base coupled to the collector of the second bipolar transistor, and an emitter for providing a second ECL level output signal;

a first current source having a first terminal coupled to the emitters of the first and second bipolar transistors and a second terminal coupled to the second power supply voltage terminal;

a second current source having a first terminal coupled to the emitters of the third and fourth bipolar transistors, and a second terminal coupled to the second power supply voltage terminal; and a third current source having a first terminal coupled to the emitters of the fifth and sixth bipolar transistors, and a second terminal coupled to the second power supply voltage terminal.

16. The ECL multiplexing circuit of claim 15, wherein the third and fourth ECL level input signals are differential clock signals, and the first and second ECL level output signals are differential output signals.

17. The ECL multiplexing circuit of claim 15, wherein the first, second, and third current sources are each an N-channel transistor.

18. The ECL multiplexing circuit of claim 15, wherein the bipolar transistors are NPN transistors.

* * * * *